United States Patent [19]

Haga et al.

[11] Patent Number: 5,403,673
[45] Date of Patent: Apr. 4, 1995

[54] FUNCTIONAL THIN FILM MEMBER

[75] Inventors: Koichi Haga; Akihiro Itoh, both of Miyagi; Hiroshi Miura, Natori, all of Japan

[73] Assignees: Ricoh Company Ltd., Tokyo; Ricoh Research Institute of General Electronics Co., Ltd., Natori, both of Japan

[21] Appl. No.: 848,358

[22] Filed: Mar. 9, 1992

[30] Foreign Application Priority Data

Mar. 8, 1991 [JP] Japan ................................. 3-067546

[51] Int. Cl.⁶ ................................................. B32B 9/00
[52] U.S. Cl. ................................. 428/688; 428/689; 428/697; 428/698; 428/699; 428/700; 428/701; 428/702
[58] Field of Search ............... 428/688, 689, 697, 698, 428/699, 700, 701, 702, 432, 469, 471, 472; 437/105, 131, 132

[56] References Cited

U.S. PATENT DOCUMENTS

| | | | |
|---|---|---|---|
| 4,238,559 | 12/1980 | Feng | 428/254 |
| 4,560,576 | 12/1985 | Lewis | 427/166 |
| 4,584,280 | 4/1986 | Manao | 428/469 |
| 4,766,008 | 8/1988 | Kodata | 427/39 |
| 4,783,369 | 11/1988 | Sugata | 428/408 |
| 4,907,846 | 3/1990 | Tustison | 428/908.8 |

OTHER PUBLICATIONS

"Formation of Defective & Semiconductor Thin Films by Laser-Assisted Evaporation", Sankur H,; Cheung, J., *Appl. Phys. A,* vol. 47, 271–284 (1988).

Primary Examiner—Ellis P. Robinson
Assistant Examiner—Timothy M. Speer
Attorney, Agent, or Firm—Oblon, Spivak, McClelland, Maier & Neustadt

[57] ABSTRACT

A functional thin film member is composed of an insulating substrate; a first single crystal thin film layer which contains at least one atom component of Si or Ge, formed on the insulating substrate; an intermediate layer with a cubic crystal system and a lattice constant difference of 15% or less with respect to the lattice constant of the single crystal thin film layer, formed on said single crystal thin film layer; and a second single crystal thin film layer of an oxide formed on the intermediate layer. The first single crystal thin film layer may include crystal orientations suitable for the properties of functional members to be provided above the single crystal thin film layer on an identical plane of the surface of the single crystal thin film layer, and the intermediate layer may be formed in at least one portion of the single crystal thin film layer, corresponding to any of the crystal orientations. In this case, a functional element utilizing the second single crystal thin film layer; and a passive or active device which is formed on the first single crystal thin film layer is electrically or optically connected to the functional element or the insulating substrate.

32 Claims, 4 Drawing Sheets

FUNCTIONAL THIN FILM MEMBER

BACKGROUND OF THE INVENTION

1. Field of the Invention

The present invention relates to a functional thin film member suitable for use in optical switches, light modulators, highly integrated circuits, infrared light sensors, ultrasonic sensors, micro-actuators, electroluminescence elements, high speed transistors, and low-resistance wiring members.

2. Discussion of Background

Conventional functional devices are composed of a substrate made of a single crystal and a single crystal thin film layer made of a variety of oxides formed on the substrate. Such functional devices, however, are difficult to apply to a functional device with a large functional area required for giant electronics. For example, a 10-inch Si wafer is produced at present. However, 6-inch to 8-inch Si wafers are in general use. From the viewpoint of the concept of machine-interface, devices with sizes corresponding to $A_5$ to $A_0$, and $B_5$ to $B_0$ sheets are necessary. However, the maximum size that can be obtained by a conventional single crystal formation technique is 10 inch. In other words, it is extremely difficult to obtain a wafer with a size of more than 10 inch by the conventional single crystal formation technique.

Furthermore, it is extremely difficult to form a thin film layer of an oxide on a substrate which contains at least one atom component of Si or Ge by the conventional method. This is because each of a Si-substrate and a Ge-substrate has a very stable oxide film layer on the surface thereof when exposed to air at room temperature. Even if such an oxide film layer is removed from the substrate, Si or Ge is oxidized again during the formation of such an oxide thin film layer, so that such an oxide thin film layer does not undergo epitaxial growth. In order to solve this problem, the following methods are mainly employed conventionally:

(1) A method of formation an oxide thin film layer at a temperature at which the oxide layer is evaporated.

(2) A method of causing a gas which etches an oxide thin film layer to flow in the course of the formation of the oxide thin film layer, whereby a competitive reaction between the etching reaction and the deposition of the oxide thin film is caused to occur.

However, these methods have the shortcomings that the temperature necessary for carrying out these methods is high and the controlling of the processes is difficult, so that it is difficult to form an oxide thin film layer in a stable manner.

SUMMARY OF THE INVENTION

It is therefore an object of the present invention to provide a functional thin film member with a Si or Ge substrate, which has a large functional area, allows the adjustment of the crystallographic orientation, and free from the problems caused by the formation of an oxidized film.

This object of the present invention can be achieved by a functional thin film member comprising: an insulating substrate; a first single crystal thin film layer which contains at least one atom component of Si or Ge, formed on the insulating substrate; an intermediate layer with a cubic crystal system and a lattice constant difference of 15% or less with respect to the lattice constant of the first single crystal thin film layer, formed on the first single crystal thin film layer; and a second single crystal thin film layer of an oxide formed on the intermediate layer.

This object can also be achieved by a functional thin film member comprising: an insulating substrate; a first single crystal thin film layer which contains at least one atom component of Si or Ge, formed on the insulating substrate, the first single crystal thin film layer having crystal orientations suitable for the properties of functional members to be provided above the single crystal thin film layer on an identical plane of the surface of the first single crystal thin film layer, an intermediate layer with a cubic crystal system and a lattice constant difference of 15% or less with respect to the lattice constant of the first single crystal thin film layer, formed in at least one portion of the first single crystal thin film layer, corresponding to any of the crystal orientations; a second single crystal thin film layer of an oxide formed on the intermediate layer; a functional element utilizing the second single crystal thin film layer; and a passive or active device which is formed on the first single crystal thin film layer and electrically or optically connected to the functional element or to the insulating substrate.

Hereinafter the first single crystal thin film layer which contains at least one atom component of Si or Ge is referred to as the single crystal Si or Ge layer, and the second single crystal thin film layer of an oxide is referred to as the single crystal oxide layer.

The intermediate layer is free from oxygen and resistant to oxidation. Hereinafter the composition of the first single crystal thin film layer is represented by $Si_X Ge_{1-X}$ wherein $0 \leq X \leq 1$. When in the intermediate layer the lattice constant difference is 15% or less with respect to the lattice constant of the single crystal Si or Ge layer, the crystallinity and surface roughness of the single crystal oxide layer formed on the intermediate layer are excellent.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
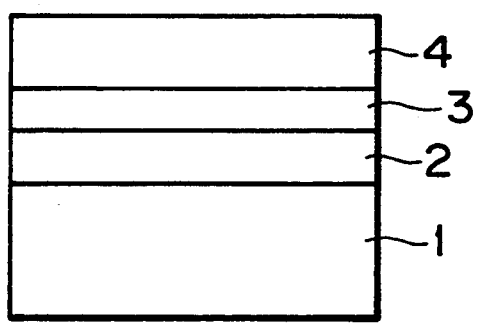
FIG. 1 is a schematic cross-sectional view of an example of a functional thin film member according to the present invention.

The electrically insulating substrate for use in the functional thin film member according to the present invention can be made of any of a single crystalline material, a polycrystalline material, and an amorphous material. The insulating material may be such a material that only a surface portion thereof is electrically insulating. For example, a substrate composed of an electroconductive material and an electrically insulating material which is coated on the surface of the electroconductive material can be employed as the electrically insulating substrate. Furthermore, a substrate composed of an electroconductive material with the surface thereof being made electrically insulating, for example, by oxidation, nitriding or carbonization of the surface thereof, can also be employed.

Examples of the single crystalline material for the electrically insulating substrate are $\alpha$-$Al_2O_3$, $CaF_2$, $SrTiO_3$, $BaTiO_3$, and $LiNbO_3$. Examples of the polycrystalline material for the insulating substrate are ceramics made of the aforementioned $\alpha$-$Al_2O_3$, $CaF_2$, $SrTiO_3$, $BaTiO_3$, and $LiNbO_3$, and polycrystals of AlN, $Y_2O_3$, $TiO_2$, and MgO. Examples of the amorphous material for the insulating substrate are $SiO_2$, $Si_3N_4$, and SiC.

In the case where the electrically insulating substrate is composed of an electroconductive material and an electrically insulating material coated on the surface of the electroconductive material, examples of the electroconductive material are Al, Ti, W, Cr, Ni, NiCr, and Mo, and examples of the electrically insulating material are $SiO_2$, and $Si_3N_4$. The electrically insulating material may be a mixture of an inorganic material such as those mentioned above, and an organic material.

The methods of forming a singly crystal film layer of $Si_xGe_{1-x}$ on the insulating material serving as the substrate can be classified into two types. In one type, a single crystalline insulating material is used as the substrate, and in the other type, a polycrystalline insulating material or an amorphous insulating material is used as the substrate.

In the case where the electrically insulating material is a single crystalline material, it is preferable that the epitaxial growth of the $Si_xGe_{1-x}$ layer be conducted on top of the single crystalline material. The epitaxial growth can be conducted by the vacuum deposition method, CVD method, MOCVD method, sputtering method, and MBE method. The epitaxial growth can be conducted not only by a gasphase growth, but also by a solid-phase growth and a liquidphase growth.

In the case where the electrically insulating material is a polycrystalline insulating material or an amorphous insulating material, it is difficult to conduct the epitaxial growth, and a conventionally employed melting and recrystallization method is employed. In this method, a polycrystalline or amorphous $Si_xGe_{1-x}$ thin film layer is deposited on the insulating substrate, and is then subjected to zone melting at a predetermined rate by application of heat to the surface thereof by use of a heat source which is capable of applying heat thereto at a temperature at which the $Si_xGe_{1-x}$ thin film layer is melt or fused. Examples of such a heat source for the zone melting are a wire heater lamp, laser beams, and a carbon heater. It is necessary that the temperature of the insulating substrate be maintained constant depending upon the temperature and moving speed of the heat source employed for the zone melting. It is preferably that the temperature of the insulating substrate be maintained at a temperature in the range of 25° C. to 1500° C., more preferably in the range of 300° C. to 1000° C. By varying the conditions for the melting and recrystallization method, such as the temperature of the heat source, the moving speed thereof, and the maintained temperature of the substrate, the crystallinity of the $Si_xGe_{1-x}$ layer can have a variety of orientations on the two-dimensional surface of the insulating substrate. This melting and recrystallization method can form a single crystalline thin film layer on a large substrate. The single crystalline thin film layer may be a single layer or a multiple layer. In the case of a multiple layer, a Si layer is formed by the melting and recrystallization method, and a $Si_xGe_{1-x}$ layer is formed on the Si layer by the epitaxial growth method. A single layer portion and a multiple layer portion may be mixedly formed on the same two-dimensional surface of the insulating substrate.

The multiple layer is provided for the elimination of the distortion caused by the thermal expansion of the layer and the lattice unconformity thereof, and for smoothly connecting layers with a different optical band gap. In particular, for the elimination of the lattice unconformity, and for the smooth connecting of layers with different optical band gaps, a quantum effect can be utilized in order to perform those effectively. When a quantum effect is utilized, it is preferable that the multiple layer have a thickness in the range of about 20 Å to 200 Å, more preferably in the range of about 50 Å to 100 Å. The number of the layers in the multiple layer is preferably 2 to 100, but when the quantum effect is utilized effectively, there is a case where the number amounts to 10,000.

When a functional oxide thin film layer is formed on the $Si_xGe_{1-x}$ layer, the surface of the $Si_xGe_{1-x}$ layer is oxidized, so that the epitaxial growth of the functional oxide thin film layer does not take place. This problem is observed when the conventional thin film formation method is employed. In order to avoid this problem, it is necessary to provide an intermediate layer on the $Si_xGe_{1-x}$ layer. Furthermore, it is necessary that the intermediate layer has a lattice constant which is close to the lattice constant of the $Si_xGe_{1-x}$ layer. Examples of materials for such an intermediate layer are materials containing Zn, such as ZnS, ZnSe, Zn(S, Se), and ZnMnSe; materials containing Ga, such as GaP, AlGaAs, and GaN; and other materials such as InP, AlAs, and AlP.

When it is necessary that the intermediate layer be electrically insulating, it is preferable that the material for the intermediate layer be such a material that contains fluorine atom, for example, $CaF_2$, $SrF_2$, $BaF_2$, (Ca, Sr)$F_2$, (Ca, Ba)$F_2$, and (Sr, Ba)$F_2$. The intermediate layers made of these materials, however, are difficult to be oriented on the (100) planes of the $Si_xGe_{1-x}$ layer, so that it will be necessary to provide these intermediate layers with a multiple layer structure. A multiple layer type intermediate layer can be constructed by providing any of the above fluorine-containing materials on the previously mentioned semiconductor materials. With the matching properties of the intermediate layer with the substrate taken into consideration, it is necessary to construct a function-separated multiple layer type intermediate layer, with respect to the ease of the lattice constant orientation, and the thermal expansion coefficient thereof. It is preferable that a single-layer type intermediate layer have a thickness in the range of 10 Å to 2000 Å, more preferably in the range of 30 Å to 1000 Å. In the case of a multiple-layer type intermediate layer, it is preferable that the intermediate layer have a thickness in the range of 10 Å to 200 Å, more preferably in the range of 20 Å to 100 Å, when the quantum effect is taken into consideration.

These intermediate layers not only serve to improve the matching properties of the upper and lower layers in contact therewith, but also serve as functional elements as the case may be. These intermediate layers can be prepared, for example, by the MBE method, the ALE method, the MOCVD method, the sputtering method, the thermal CVD method, the plasma CVD method, and the MOCVD method.

An oxide thin film layer is then deposited on any of the above intermediate layers. By way of example of the oxide thin film layer, a ferroelectric thin film layer which contains Pb and a $YBa_2Cu_3O_7$ superconductive thin film layer will now be explained. Examples of the ferroelectric thin film layer are $PbTiO_3$, $(Pb, La)TiO_3$, $Pb(Zr, Ti)O_3$, and $(Pb, La)(Zr, Ti)O_3$ layers.

The above oxide thin film layer can be constructed either in the form of a single layer or in the form of a multiple layer, depending upon its application purposes. It is preferable that the oxide thin film layer in the form of a single layer have a thickness in the range of 0.1 μm to 20 μm, more preferably in the range of 0.2 μm to 15 μm. When the oxide thin film layer is made in the form of a multiple layer, there are the case where the oxide thin film layer is used by utilizing the quantum effect and the case where the oxide thin film layer is used by other methods. In the former case, it is preferable that the oxide thin film layer have a thickness in the range of 10 Å to 200 Å, more preferably in the range of 20 Å to 100 Å. When a multiple layer includes 100 to 5000 overlaid oxide thin film layers, it is possible to use such a multiple layer in a device utilizing quantum effect. A function-separated type multiple layer can also be constructed by separating the contained layers thereof into layers having a piezoelectric function and layers having a ferroelectric function. These oxide thin film layers can be prepared, for example, by the MBE method, the ALE method, the EB method, the MOCVD method, the sputtering method, and the thermal CVD method.

FIG. 1 shows a schematic cross-sectional view of the structure of an example of a functional thin film member according to the present invention. This functional thin film member comprises a $Si_xGe_{1-x}$ layer 2, an intermediate layer 3, and a single crystal oxide layer 4 are successively overlaid on an electrically insulating substrate 1.

Figure 2:
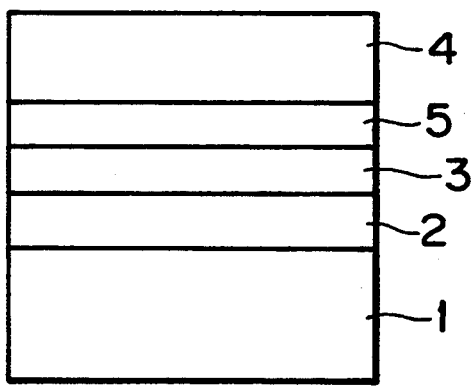
FIG. 2 is a schematic cross-sectional view of another example of a functional thin film member according to the present invention.

A $YBa_2Cu_3O_7$ superconductive thin film layer can be fabricated in the same manner as in the case of the above-mentioned Pb-based ferroelectric thin film layer. However, the laser abrasion method, the sputtering method, and the MOCVD method are suitable for the fabrication of the $YBa_2Cu_3O_7$ superconductive thin film layer. An oxide buffer layer 5 may be interposed between the intermediate layer 3 and the single crystal oxide layer 4 as in FIG. 2. Examples of the material for the single crystal oxide layer 4 are SiO, SiN, $Y_2O_3$, $\gamma$-$Al_2O_3$, $TiO_2$, MgO, $SrTiO_3$, $BaTiO_3$, $LiMbO_3$, $LiTaO_3$, and $MgAl_2O_4$.

The features of this invention will become apparent in the course of the following description of exemplary embodiments which are given for illustration of the invention and are not intended to be limiting thereof.

EXAMPLES 1 TO 3 AND COMPARATIVE EXAMPLES 1 AND 2

Figure 3:
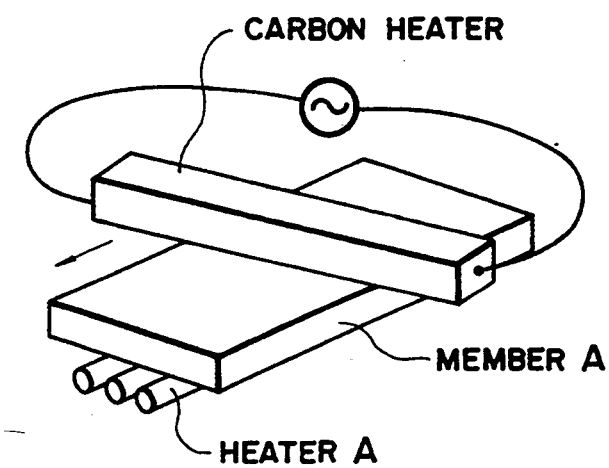
FIG. 3 is a schematic diagram in explanation of the formation of a $SiO_2$ cap layer conducted in Example 1.

A polysilicone thin film layer (hereinafter referred to as the Si thin film layer) was formed on a 1 mm thick quartz substrate by the CVD method by which a $SiH_4$ gas was decomposed. A $SiO_2$ cap layer was formed on the Si thin film layer, whereby a member A as shown in FIG. 3 was fabricated.

The thus fabricated member A was heated to 1000° C. by a heater A, above which the fabricated member A was situated. The member A was heated by a carbon heater heated to 1600° C. which was situated above the member A as the carbon heater was moved in the direction of the arrow at a speed of 1 mm/sec. The $SiO_2$ cap layer was then removed by a HF solution. The Si thin film layer exhibited a (100) plane as the surface orientation plane after the removal of the $SiO_2$ cap layer.

Five intermediate layers with a thickness of 2000 Å and different lattice constants as specifically shown in Table 1 were fabricated by the MOCVD method in film formation apparatus, using five members A fabricated above under a pressure of 50 Torr with the back pressure of the film formation apparatus set at $10^{-9}$ Torr.

The lattice constant of the Si thin film layer was 5.432 Å, which is slightly larger than that of a Si wafer. It is considered that this is because of the thermal expansion distortion between the quartz and the Si thin film layer. The materials employed for the intermediate layer are ZnS, GaAs, ZnSe in Examples 1 to 3, and CdTe and diamond in Comparative Examples 1 and 2 as shown in Table 1.

A $PbTiO_3$ thin film layer with a thickness of 1 μm was formed by the MOCVD method on each intermediate layer. The possibility of the epitaxial growth after the formation of the $PbTiO_3$ thin film layer was also indicated in Table 1, in which mark "o" indicates that the epitaxial growth is possible, and mark "x" indicates that the epitaxial growth is impossible. The surface smoothnesses of the $PbTiO_3$ thin film layers formed on the intermediate layers are provided in Table 1. The lattice constant difference of each intermediate layer which is defined as follows is also provided in Table 1:

$$\frac{\text{Lattice Constant of Si} - \text{Lattice Constant of Intermediate Layer}}{\text{Lattice Constant of Si}} \times 100\%$$

TABLE 1

| Ex. | Material for Intermediate Layer | Lattice Constant of Intermediate Layer | Possibility of Epitaxial Growth of $PbTiO_3$ Layer | Surface Roughness of $PbTiO_3$ Layer | Lattice Constant Difference between Si Layer and Intermediate Layer (%) |
|---|---|---|---|---|---|
| Ex. 1 | ZnS | 5.41 | o | ⊚ | 0.3 |
| Ex. 2 | GaAs | 5.65 | o | o | 4 |

TABLE 1-continued

| Ex. | Material for Intermediate Layer | Lattice Constant of Intermediate Layer | Possibility of Epitaxial Growth of PbTiO$_3$ Layer | Surface Roughness of PbTiO$_3$ Layer | Lattice Constant Difference between Si Layer and Intermediate Layer (%) |
| --- | --- | --- | --- | --- | --- |
| Ex. 3 | ZnSe | 5.68 | ○ | ○ | 4.6 |
| Comp. Ex. 1 | CdTe | 6.50 | X | X | 19 |
| Comp. Ex. 2 | Diamond | 3.57 | X | X | 34 |

Note:
In the evaluation of the surface roughness of the PbTiO$_3$ layer,
"X": 5 μm < Rmax,
"○": 0.5 μm < Rmax < 5 μm
"⊚": Rmax < 0.5 μm The results shown in Table 1 indicate that when the lattice constant difference between the Si thin film layer and the intermediate layer exceeds 19%, the surface smoothness of the PbTiO$_3$ layer is no good, and there is no possibility of epitaxial growth in the PbTiO$_3$ layer.

EXAMPLE 4

The procedure for Example 1 was repeated except that each of the following intermediate layers of Cd$_x$Zn$_{1-x}$Te, wherein $0 \leq X \leq 1$, with a thickness of 2000 Å, and with different lattice constant differences as shown in Table 2, was caused to grow by the MOCVD method under the same conditions as in Example 1. The results are shown in the following Table 2:

TABLE 2

| Value of X | Lattice Constant Difference between Si Layer and Intermediate Layer (%) | Crystallinity of PbTiO$_3$ Layer | Surface Roughness of PbTiO$_3$ Layer |
| --- | --- | --- | --- |
| 0 | 12 | ⊚ | ⊚ |
| 0.35 | 14.45 | ⊚ | ○ |
| 0.4 | 14.8 | ○ | ○ |
| 0.43 | 15.01 | ○ | Δ |
| 0.6 | 16.2 | Δ | Δ |
| 0.88 | 18.16 | X | X |
| 1.0 | 19 | X | X |

Note:
⊚: very good; ○: good; Δ: not good; x: bad

The above results indicate that when the difference in the lattice constant between the Si thin film layer and the intermediate exceeds 15%, the crystallinity and surface rouhness of the PbTiO$_3$ layer become impaired. Therefore it is preferable that the lattice constant difference be not more than 15%.

EXAMPLE 5

The procedure for Example 1 was repeated except that an oxide buffer layer consisting of a Y$_2$O$_3$ thin layer with a thickness of 200 Å and a (Pb, La) (Zr, Ti)O$_3$ thin layer with a thickness of 1 μm overlaid on the Y$_2$O$_3$ thin layer, which were formed by the MBE method, was interposed between the ZnSe intermediate layer and the PbTiO$_3$ thin film layer, whereby a functional thin film layer member was fabricated.

The adhesiveness between the intermediate layer and the the PbTiO$_3$ thin film layer was found to be increased by about 25% by the provision of the above oxide buffer layer in comparison with the functional thin film layer without the buffer layer by an adhesion test using an adhesive test and visual inspection.

EXAMPLE 6

Figure 4:
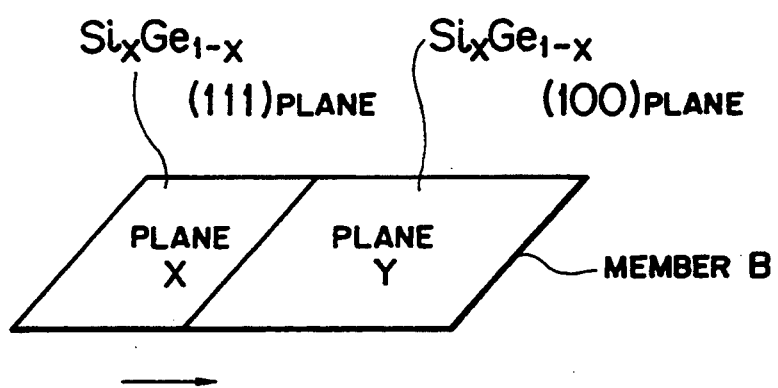
FIG. 4 is a schematic diagram in explanation of the formation of a member B employed in Example 6.

When the temperature of the carbon heater shown in FIG. 3 was changed in the course of the fabrication of the member A shown in FIG. 3, a member B having X and Y orientation planes, namely (111) plane and (100) plane, was obtained as shown in FIG. 4. In the figure, the arrow indicates the scanning direction of the carbon heater. A Pb-based oxide thin film as employed in Example 1 was deposited and a transistor for driving an optical switch, which will be described later, was formed, whereby a functional thin film member was obtained. The thus fabricated thin film member had a sufficient surface roughness and crystallinity for driving the two devices.

The above-mentioned Pb-based single crystal thin film has a sufficient surface roughness for using it as a ferro-electric member.

Devices which use the above-mentioned functional thin film member will now be explained in detail. Examples of an optical device using the above-mentioned functional thin film member include optical switches, light modulators, electroluminescence elements, highly integrated circuits, condensers for optical highly integrated memories, infrared light sensors, ultrasonic sensors, micro-actuators, and non-linear optical elements. The Pb-based single crystal thin film layer is formed on a single crystal substrate containing at least one of Si atom or Ge atom. Devices using the above-mentioned ferroelectric materials can be directly driven by drive circuits of a transistor which uses the single crystal substrate. Furthermore, O—O, O—E, and E—O devices can be fabricated by combining a sensor or a light emitting element formed on a substrate which contains at least one of Si atom or Ge atom, with a device which uses the above-mentioned ferroelectric material.

Examples of a light switch and an electroluminescence element will now be explained. to begin with a TIR type switch, which is a kind of waveguide switch.

On a Si$_x$Ge$_{1-x}$ thin film substrate deposited on a quartz substrate, which was previously explained with reference to FIG. 3, one or more layers selected from the group consisting of ZnS, ZnSe, ZnS(Se), CaS, GaP, AlGaAs, GaAs, InP, SrF$_2$, and CaF$_2$ layers, which are cubic crystals, with a lattice constant of 5.2 Å to 5.9 Å, were formed as one or more intermediate layers, with a thickness of 10 Å to 30,000 Å with epitaxial growth. It is preferable that one or more intermediate layers be deposited by the MBE method, the MOCVD method, and the MLE method.

In order to increase the adhesiveness between the intermediate layer and a layer formed on the intermediate layer, and to decrease the light absorption by the intermediate layer, a single crystal buffer layer of an oxide, such as $Y_2O_3$, $La_2O_3$, $Al_2O_3$, $TiO_2$, MgO, $SrTiO_3$, $BaTiO_3$, $LiNbO_3$, $LiTaO_3$, or $MgAl_2O_4$, each of which has a smaller refractive index than the refractive index of the Pb-based oxide single crystal thin film layer. It is preferable that the thickness of the single crystal buffer layer be in the range of 100 Å to 10000 Å.

On the above single crystal buffer layer, there is provided at least one ferroelectric thin film layer with a perovskite structure, which contains Pb atom. This ferroelectric thin film layer is made of, for example, (Pb, La)$TiO_3$, Pb(Zn, Ti)$O_3$, or (Pb, La) (Zn, Ti)$O_3$. It is preferable that the total thickness of one or more ferroelectric thin film layers be in the range of 100 Å to 30000 Å. The ferroelectric thin film layers can be formed by the MBE method, the MOCVD method, the ALE method, or the plasma CVD method.

On the above ferroelectric thin film layer, there is provided an upper butter layer which is made of, for example, a polycrystalline or amorphous $Ta_2O_5$, $SiO_2$, $Y_2O_3$, or $TiO_2$, with a thickness of 100 Å to 5000 Å.

An electrode made of, for example, Al, Au, Pt, ITO, $In_2O_3$, or $SnO_2$, is provided on the upper buffer layer by the vacuum deposition method or by the sputtering method. Drive circuits for driving the thus fabricated light switch can be provided on the $Si_xGe_{1-x}$ thin film substrate.

By way of example, a double insulating type EL device which utilizes the functional thin member of the present invention will now be explained.

An intermediate layer composed of one or more layers, made of, for example, ZnS, ZnSe, Zn(S, Se), CaS, SrS, GaP, AlGaAs, GaAs, $CaF_2$, $SrF_2$, or $BaF_2$, is formed by epitaxial growth, with a thickness of 10 Å to 30000 Å, on the member A as shown in FIG. 3. The epitaxial growth was conducted by the same method as employed in the fabrication of the light switch.

The same ferroelectric layer as mentioned previously which is composed of one or more layers and has excellent crystallinity, with a thickness of 100 Å to 10000 Å, is provided on the above intermediate layer. A single crystalline light emitting layer is then caused to grow on the above ferroelectric layer. The light emitting layer is composed of a matrix made of a material such as ZnS, ZnSe, or Zn(S, Se), and a luminescence center made of a material such as a ZnS:Mn-based material which includes Mn, a ZnS:Cu-based material which includes Cu, or a rare earth metal—fluorine—based material such as $TbF_3$, $ErF_3$, $NdF_3$, and $SmF_3$. Materials composed of SrS or CaS as a matrix and Ce, Sm, Tb, Er, or Mn as a luminescence center can also be employed for the light emitting layer. The structure of the light emitting layer is not limited to a single layer type, but a multiple-layer-type light emitting layer can also be employed.

On the above light emitting layer, there is provided an upper insulating layer, which is made of an amorphous, polycrystalline or epitaxially grown film of, for example, $SiO_2$, SiON, $Si_3N_4$, ZnO, $Al_2O_3$, MgO, $SrTiO_3$, $Y_2O_3$, $TaO_5$, $MgAl_2O_4$, $CaF_2$, $SrF_2$, or $BaF_2$, with a thickness of 100 Å to 10000 Å. The upper insulating layer can be fabricated by the MBE method, the ALE method, the sputtering method, or the EB method.

EXAMPLE 7

A TIR type light switch was fabricated on the member A as shown in FIG. 3, which was formed on a quartz substrate, and included an intermediate layer made of ZnS.

The member A had a (100) plane. A ZnS intermediate layer was formed with a thickness of 500 Å on the member A, at a substrate temperature of 500° C., by the MBE method. The ZnS intermediate layer had a zincblend structure and exhibited excellent orientation with a (100) plane.

A ferroelectric layer with a composition of $(Pb_{0.84}La_{0.16})$ $(Zr_{0.5}Ti_{0.5})_{0.96}O_3$ was formed with a thickness of 4000 Å by the MOCVD method on the above-fabricated intermediate layer. The thus fabricated ferroelectric layer had a perovskite structure with a (100) plane, and excellent surface roughness.

Figure 5:
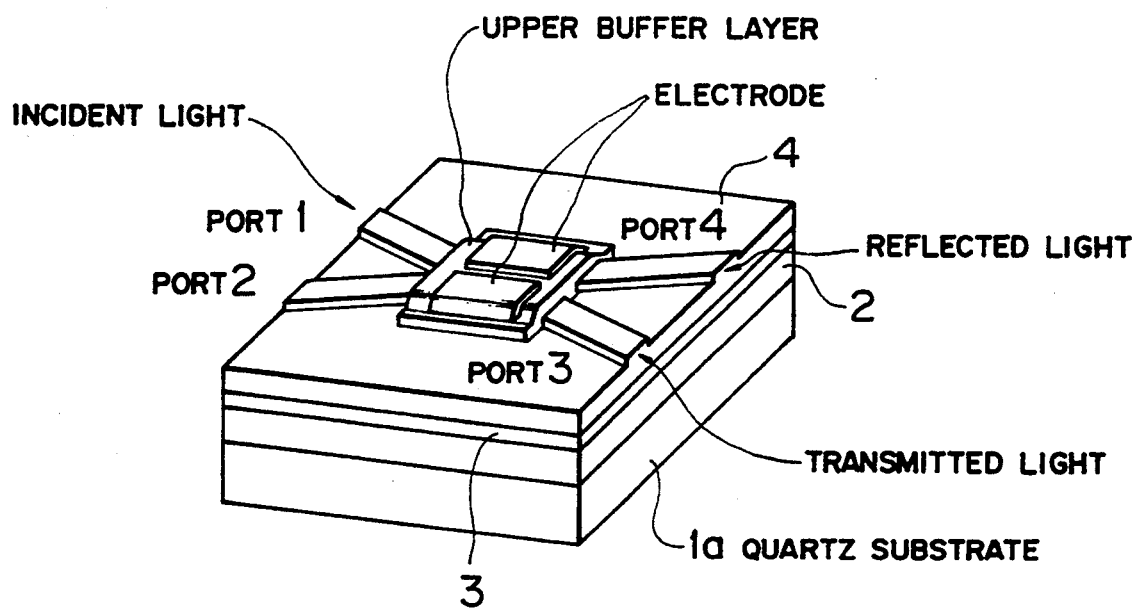
FIG. 5 is a schematic perspective view of a TIR type light switch fabricated in Example 7.

A ridge wave guide with a width of 25 μm, a thickness of 600 Å, and a crossing angle of 2° as shown in FIG. 5 was fabricated by ion beam etching. A $Ta_2O_5$ thin layer with a thickness of 2000 Å was formed as a buffer layer in the crossing section by the sputtering method in order to prevent the wave guide loss. An Al planar electrode with a thickness of 2000 Å, including a 1.7 mm long and 5 μm wide electrode gap, was provided on the Al planar electrode.

A switching operation test was conducted by leading a He-Ne laser beam into the wave guide by use of a GaP prism. The switching operation was possible with a drive voltage of 15 V, and the extinction ration was 11 dB.

COMPARATIVE EXAMPLE 3

The procedure for Example 7 was repeated except that the ZnS intermediate layer employed in Example 4 was not provided, whereby a comparative TIR type light switch was fabricated. The ferroelectric layer formed in this comparative TIR type light switch was a polycrystal which included a mixture of (110), (101), (100) and (001) planes. The switching operation was impossible unless a drive voltage of as high as 30 V was applied. The extinction ratio was 5 dB, which was obviously insufficient for use in practice.

EXAMPLE 8

An EL (electroluminescence) element was fabricated by providing an intermediate layer of GaAs with a crystallographic orientation (100) plane on the member A as shown in FIG. 3, which was formed on a quartz substrate.

More specifically, the GaAs intermediate layer was formed with a thickness of 300 Å on the member A at a substrate temperature of 500° C. by the MBE method. The thus formed GaAs intermediate layer had a zincblend structure and a (100) plane operation. A $PbTiO_3$ ferroelectric layer was then formed with a thickness of 3000 Å on the GaAs intermediate layer at a substrate temperature of 530° C. by the sputtering method.

The thus formed ferroelectric layer had a perovskite structure and a (100) plane orientation. A ZnS:Mn (Mn 0.5 atm%) light emitting layer with a thickness of 3000 Å was formed on the ferroelectric layer at a substrate temperature of 450° C. by the MOCVD method. The thus formed light emitting layer had a (100) plane orientation.

A $Si_3N_4$ upper insulating layer with a thickness of 3000 Å was formed on the above light emitting layer at a substrate temperature of 250° C. by the plasma CVD method. The thus formed upper insulating layer was an amorphous film layer.

Figure 6:
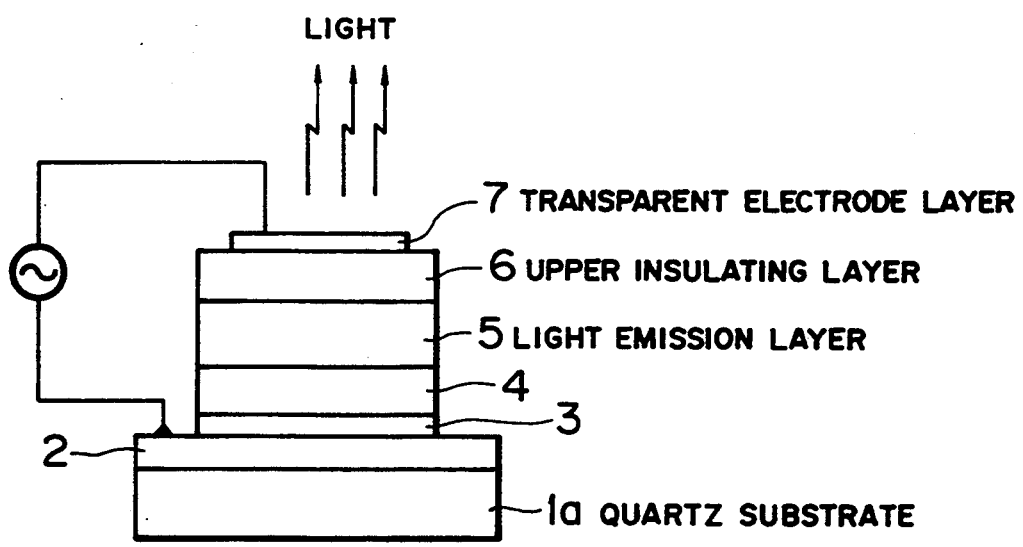
FIG. 6 is a schematic cross-sectional view of an EL device fabricated in Example 8.

Finally, an ITO transparent electrode film with a thickness of 2000 Å was formed on the $Si_3N_4$ upper insulating layer at a substrate temperature of 250° C. by the sputtering method, whereby the EL element was fabricated. FIG. 6 shows a schematic cross-sectional view of the thus fabricated EL element.

The light emission from this EL element was observed from the ITO side by application of an AC voltage with a frequency of 3 KHz across the ITO transparent electrode film and the Si single crystal substrate. The result was that the light emission initiation voltage of this EL element was 130 V and a luminance of 5000 cd/m² was obtained under the application of 150 V.

COMPARATIVE EXAMPLE 4

Figure 7:
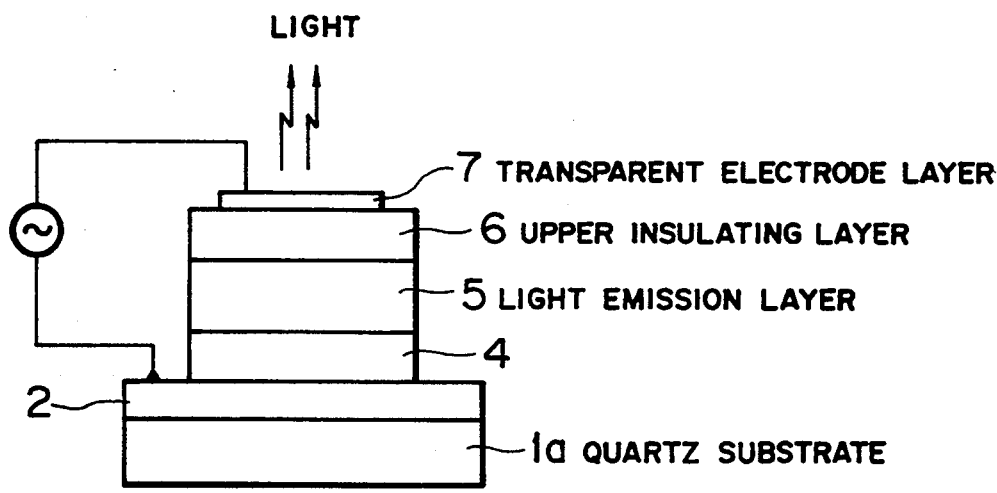
FIG. 7 is a schematic cross-sectional view of a comparative El device explained in Comparative Example 4.

The procedure for Example 8 was repeated except that the GaAs intermediate layer employed in Example 8 was not provided, whereby a comparative EL element was fabricated as shown in FIG. 7. The $PbTiO_3$ layer formed directly on the Si single crystal substrate in this EL element was a poly-crystal which included a mixture of (110), (101), (100) and (001) planes. The ZnS:Mn light emitting layer also had a zinc blend structure and (220) plane and (331) plane orientations and was polycrystalline.

The light emission initiation voltage of this comparative EL element measured under the same conditions as in Example 8 was 150 V, and the luminance thereof under the same conditions as in Example 8 was 3500 cd/m² even near 300 V, which was a break-down voltage of this comparative EL element.

The EL element fabricated in Example 8 exhibited a greater maximum luminance, and a smaller light emission initiation voltage than the maximum luminance and the light emission initiation voltage of the comparative EL element fabricated in Comparative Example 4, respectively.

It is considered that the principal reason for the EL element fabricated in Example 8 having a greater maximum luminance than that of the comparative EL element fabricated in Comparative Example 4 is that the crystanity of the $PbTiO_3$ layer fabricated in Example 8 was better than that of the $PbTiO_3$ layer fabricated in Comparative Example 4 because of the provision of the intermediate layer in Example 5, so that a ZnS:Mn light emitting layer with a better crystanity was caused to grow in Example 8 than that of the SnZ:Mn light emitting layer in Comparative Example 4.

Furthermore, the principal reason for the EL element fabricated in Example 8 having a smaller light emission initiation voltage than that of the comparative EL element fabricated in Comparative Example 4 is considered that the $PbTiO_3$ layer fabricated in Example 8 had the (001) plane orientation which provided a higher dielectric constant, whereby a drive voltage was efficiently applied to the light emitting layer in comparison with the drive voltage applied to the light emitting layer in Comparative Example 4.

Figure 8:
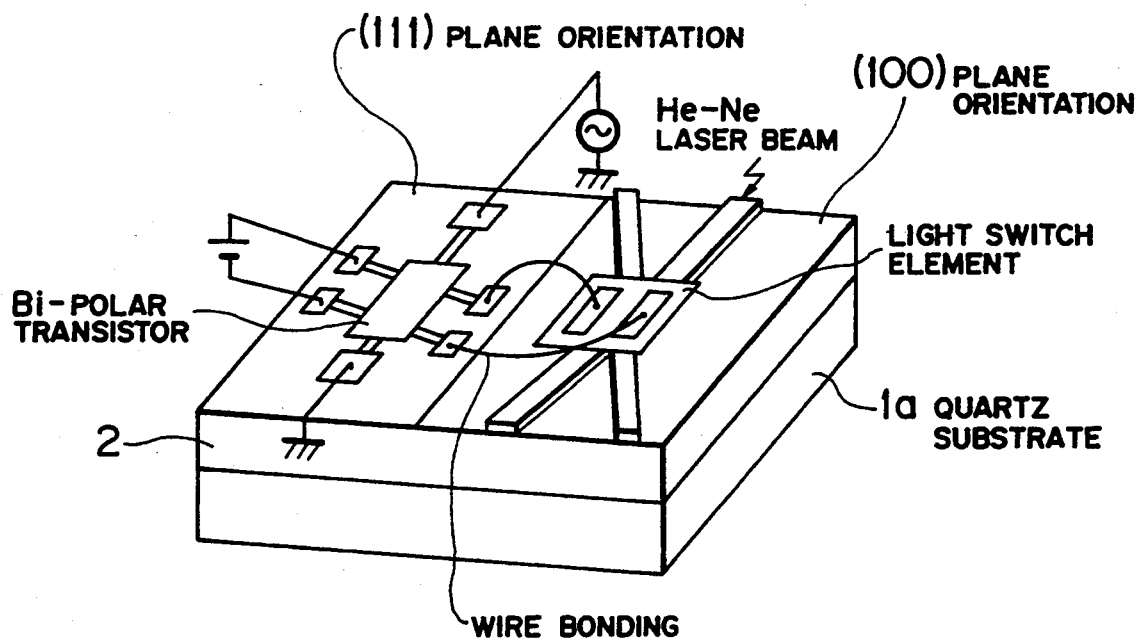
FIG. 8 is a schematic perspective view of a device fabricated in Example 9.

By use of, for example, the member B as shown in FIG. 4, which includes the (111) plane on plane X and the (100) on plane Y, another functional device of the present invention as illustrated in FIG. 8 can be fabricated.

More specifically, a single crystal thin film layer which contains at least one atom component of Si or Ge is provided on an insulating substrate, for instance, a substrate made of quartz. In the course of the provision of the single crystal thin film layer on the insulating substrate, crystal orientations suitable for the properties of functional members to be provided on the single crystal thin film layer are formed on an identical plane of the surface of the single crystal thin film layer. An intermediate layer with a cubic crystal system, and a 15% or less lattice constant difference with respect to the lattice constant of the single crystal thin film layer. A thin film of an oxide is provided on the intermediate layer. The thin film of an oxide on the single crystal thin film layer provided on the single crystal thin film layer via the intermediate layer constitutes a functional element, such as a light switch element fabricated in Example 7. Furthermore, a passive element or an active element such as a bi-polar transistor is provided on the single crystal thin film layer which contains at least one atom component of Si or Ge, or on another insulating substrate on which the single crystal thin film layer is provided, and electrically or optically connected to the aforementioned functional element.

The following is a specific example of the above functional device according to the present invention.

EXAMPLE 9

On the member B as shown in FIG. 4, which includes the (111) plane on plane X and the (100) plane on plane Y, a light switch element was provided on the (100) plane in the same manner as in Example 7, and a bi-polar transistor as shown in FIG. 8 was provided, whereby another functional thin film device of the present invention as illustrated in FIG. 8 was fabricated.

Thus, according to the present invention, the ferroelectric thin film layer can be caused to grow with excellent crystallinity by the provision of the intermediate layer between the ferroelectric thin film layer and the $Si_xGe_{1-x}$ layer with the orientation thereof being appropriately controlled by the melting and recrystallization method. As a result, a functional thin film device with the best use of the characteristics of the ferroelectric film layer can be fabricated.

Furthermore, according to the present invention, elements which can drive the element fabricated by providing a ferroelectric thin film layer as a $Si_xGe_{1-x}$ layer can be provided. The combination of these elements can provide high quality functional thin film devices of a composite type formed on the same plane.

What is claimed is:

1. A functional thin film member comprising: an insulating substrate;
   a first single crystal thin film layer comprising a single crystal of $Si_x Ge_{1-x}$, wherein $0 \leq X \leq 1$, formed on said insulating substrate;
   an intermediate layer with a cubic crystal system and a lattice constant difference of 15% or less with respect to the lattice constant of said first single crystal thin film layer, formed on said first single crystal thin film layer, said intermediate layer being free from oxygen and resistant to oxidation; and
   a second single crystal thin film layer of an oxide formed on said intermediate layer.

2. The functional thin film member as claimed in Clain 1, wherein said insulating substrate comprises a single crystalline material selected from the group consisting of $\alpha$-$Al_2O_3$, $CaF_2$, $SrTiO_3$, $BaTiO_3$, and $LiNbO_3$.

3. The functional thin film member as claimed in Claim 1, wherein said insulating substrate comprises a polycrystalline material selected from the group consisting of ceramics made from $\alpha$-$Al_2O_3$, $CaF_2$, $SrTiO_3$, $BaTiO_3$, or $LiNbO_3$, and polycrystals of AlN, $Y_2O_3$, $TiO_2$, and MgO.

4. The functional thin film member as claimed in claim 1, wherein said insulating substrate comprises an amorphous material selected from the group consisting of $SiO_2$, $Si_3N_4$, and SiC.

5. The functional thin film member as claimed in claim 1, wherein said insulating substrate comprises an electroconductive material and an electrically insulating material which is coated on said electroconductive material.

6. The functional thin film member as claimed in claim 5, wherein said electroconductive material is selected from the group consisting of Al, Ti, W, Cr, Ni, NiCr, and Mo, and said electrically insulating material is selected from the group consisting of $SiO_2$, and $Si_3N_4$.

7. The functional thin film member as claimed in claim 1, wherein said intermediate layer comprises a material selected from the group consisting of ZnS, ZnSe, Zn(S, Se), and ZnMnSe.

8. The functional thin film member as claimed in claim 1, wherein said intermediate layer comprises a material selected from the group consisting of GaP, AlGaAs, and GaN.

9. The functional thin film member as claimed in claim 1, wherein said intermediate layer comprises a material selected from the group consisting of InP, AlAs, and AlP.

10. The functional thin film member as claimed in claim 1, wherein said intermediate layer comprises a material selected from the group consisting of $CaF_2$, $SrF_2$, $BaF_2$, $(Ca, Sr)F_2$, $(Ca, Ba)F_2$, and $(Sr, Ba)F_2$.

11. The functional thin film member as claimed in claim 1, wherein said second single crystal thin film layer is a ferroelectric layer.

12. The functional thin film member as claimed in claim 11, wherein said ferroelectric layer comprises a material selected from the group consisting of $PbTiO_3$, $(Pb, La)TiO_3$, $Pb(Zr, Ti)O_3$, and $(Pb, La)(Zn, Ti)O_3$.

13. The functional thin film member as claimed in claim 1, wherein said second single crystal thin film layer is a superconductive thin film layer comprising $YBa_2Cu_3O_7$.

14. The functional thin film member as claimed in claim 1, further comprising a buffer layer comprising an oxide between said intermediate layer and said second single crystal thin film layer.

15. The functional thin film member as claimed in claim 14, wherein said oxide for said buffer layer is a single crystal selected from the group consisting of SiO, SiN, $Y_2O_3$, $\gamma$-$Al_2O_3$, $TiO_2$, MgO, $SrTiO_3$, $BaTiO_3$, $LiNbO_3$, $LiTaO_3$, and $MgAl_2O_4$.

16. A functional thin film member comprising:
an insulating substrate;
a first single crystal thin film layer comprising a single crystal of $Si_x Ge_{1-x}$, wherein $0 \leq X \leq 1$, formed on said insulating substrate, said first single crystal thin film layer having crystal orientations suitable for the properties of functional members to be provided above said first single crystal thin film layer on an identical plane of the surface of said first single crystal thin film layer,
an intermediate layer with a cubic crystal system and a lattice constant difference of 15% or less with respect to the lattice constant of said first single crystal thin film layer, formed in at least one portion of said first single crystal thin film layer, corresponding to any of said crystal orientations, said intermediate layer being free oxygen and resistant to oxidation;
a second single crystal thin film layer of an oxide formed on said intermediate layer;
a functional element utilizing said second single crystal thin film layer; and
a passive or active device which is formed on said first single crystal thin film layer and electrically or optically connected to said functional element or said insulating substrate.

17. The functional thin film member as claimed in claim 16, wherein said insulating substrate comprises a single crystalline material selected from the group consisting of $\alpha$-$Al_2O_3$, $CaF_2$, $SrTiO_3$, $BaTiO_3$, and $LiNbO_3$.

18. The functional thin film member as claimed in claim 16, wherein said insulating substrate comprises a polycrystalline material selected from the group consisting of ceramics made from $\alpha$-$Al_2O_3$, $CaF_2$, $SrTiO_3$, $BaTiO_3$, or $LiNBO_3$, and polycrystals of AlN, $Y_2O_3$, and MgO.

19. The functional thin film member as claimed in claim 16, wherein said insulating substrate comprises an amorphous material selected from the group consisting of $SiO_2$, $Si_3N_4$, and SiC.

20. The functional thin film member as claimed in claim 16, wherein said insulating substrate comprises an electroconductive material and an electrically insulating material which is coated on said electroconductive material.

21. The functional thin film member as claimed in claim 20, wherein said electroconductive material is selected from the group consisting of Al, Ti, W, Cr, Ni, NiCr, and Mo, and said electricallly insulating material is selected from the group consisting of $SiO_2$, and $Si_3N_4$.

22. The functional thin film member as claimed in claim 16, wherein said intermediate layer comprises a material selected from the group consisting of ZnS, ZnSe, Zn(S, Se), and ZnMnSe.

23. The functional thin film member as claimed in claim 16, wherein said intermediate layer comprises a material selected from the group consisting of GaP, AlGaAs, and GaN.

24. The functional thin film member as claimed in claim 16, wherein said intermediate layer comprises a material selected from the group consisting of InP, AlAs, and AlP.

25. The functional thin film member as claimed in claim 16, wherein said intermediate layer comprises a material selected from the group consisting of $CaF_2$, $SrF_2$, $BaF_2$, $(Ca, Sr)F_2$, $(Ca, Ba)F_2$, and $(Sr, Ba)F_2$.

26. The functional thin film member as claimed in claim 16, wherein said second single crystal thin film layer is a ferroelectric layer.

27. The functional thin film member as claimed in claim 26, wherein said ferroelectric layer comprises a material selected from the group consisting of $PbTiO_3$, $(Pb, La)TiO_3$, $Pb(Zn, Ti)O_3$, and $(Pb, La)(Zr, Ti)O_3$.

28. The functional thin film member as claimed in claim 16, wherein said second single crystal thin film layer is a superconductive thin film layer comprising $YBa_2Cu_3O_7$.

29. The functional thin film member as claimed in claim 16, further comprising a buffer layer comprising an oxide between said intermediate layer and said second single crystal thin film layer.

30. The functional thin film member as claimed in claim 29, wherein said oxide for said buffer layer is a single crystal selected from the group consisting of SiO, SiN, $Y_2O_3$, $\gamma$-$Al_2O_3$, $TiO_2$, MgO, $SrTiO_3$, $BaTiO_3$, $LiMbO_3$, $LiTaO_3$, and $MgAl_2O_4$.

31. The functional thin film member as claimed in claim 16, wherein said functional element is a light switch.

32. The functional thin film member as claimed in claim 16, wherein said active device is a bi-polar transistor.

* * * * *

UNITED STATES PATENT AND TRADEMARK OFFICE
CERTIFICATE OF CORRECTION

PATENT NO. : 5,403,673
DATED : April 4, 1995
INVENTOR(S) : KOICHI HAGA ET AL

It is certified that error appears in the above-indentified patent and that said Letters Patent is hereby corrected as shown below:

Column 3, line 51, "gasphase" should read --gas-phase--; and
line 52, "liquidphase" should read --liquid-phase--.
Column 4, line 3, "C." should read --C--; and
line 4, "C.," should read --C,-- and "300°C." should read --300°C--.
Column 6, lines 18 and 21, "C." should read --C--.
Column 10, line 9, "C.," should read --C,--; and
lines 54, 59, and 64, "C." should read --C--.
Column 11, lines 1 and 6, "C." should read --C--.
Column 13, line 53, "SrTio$_3$" should read --SrTiO$_3$--.
Column 14, line 23, "and MgO." should read --TiO$_2$, and MgO.--.

Signed and Sealed this

Seventeenth Day of September, 1996

Attest:

BRUCE LEHMAN

*Attesting Officer*    Commissioner of Patents and Trademarks